US007157908B1

(12) United States Patent
Datsikas

(10) Patent No.: US 7,157,908 B1
(45) Date of Patent: Jan. 2, 2007

(54) MAGNETIC RESONANCE IMAGING USING BESSEL FUNCTIONS

(75) Inventor: Thomas Datsikas, Melville, NY (US)

(73) Assignee: Fonar Corporation, Melville, NY (US)

( * ) Notice: Subject to any disclaimer, the term of this patent is extended or adjusted under 35 U.S.C. 154(b) by 0 days.

(21) Appl. No.: 10/314,999

(22) Filed: Dec. 10, 2002

(51) Int. Cl.
  *G01V 3/00* (2006.01)
(52) U.S. Cl. .................................................... 324/307
(58) Field of Classification Search ................ 324/307, 324/309, 310, 312, 318, 322, 314
  See application file for complete search history.

(56) References Cited

U.S. PATENT DOCUMENTS

| | | | | |
|---|---|---|---|---|
| 4,639,671 A | * | 1/1987 | Macovski | 324/309 |
| 4,680,545 A | * | 7/1987 | Gray et al. | 324/307 |
| 4,746,860 A | * | 5/1988 | Satoh | 324/309 |
| 4,995,394 A | * | 2/1991 | Cline et al. | 600/410 |
| 4,998,065 A | * | 3/1991 | Koizumi | 324/309 |
| 5,003,264 A | * | 3/1991 | Koizumi et al. | 324/309 |
| 5,016,637 A | * | 5/1991 | Koizumi et al. | 600/419 |
| 5,099,848 A | * | 3/1992 | Parker et al. | 600/443 |
| 5,192,909 A | * | 3/1993 | Hardy et al. | 324/309 |
| 5,202,631 A | * | 4/1993 | Harms et al. | 324/309 |
| 5,251,629 A | * | 10/1993 | Koizumi et al. | 600/410 |
| 5,365,172 A | * | 11/1994 | Hrovat et al. | 324/309 |
| 5,415,163 A | * | 5/1995 | Harms et al. | 600/410 |
| 5,689,189 A | * | 11/1997 | Morich et al. | 324/318 |
| 5,757,187 A | * | 5/1998 | Wollin | 324/306 |
| 6,309,353 B1 | * | 10/2001 | Cheng et al. | 600/437 |
| 6,528,997 B1 | * | 3/2003 | Zhong et al. | 324/307 |
| 6,566,873 B1 | * | 5/2003 | Smith et al. | 324/300 |
| 6,605,942 B1 | * | 8/2003 | Warren | 324/307 |

OTHER PUBLICATIONS

Zhang et al., "Measurement of flow velocities by NMR using a spatially modulated RF field", Measuments and Science Technology 9, IOP Publishing, 1998, pp. 670-675.*
Arnold J. den Dekker, "Implications of the Rician distribution for fMRI generalized likelihood radio tests" Magnetic Resonance Imaging 23, 2005, pp. 953-959.*

* cited by examiner

*Primary Examiner*—Brij Shrivastav
*Assistant Examiner*—Dixomara Vargas
(74) *Attorney, Agent, or Firm*—NixonPeabody, LLP; Raymond VanDyke

(57) ABSTRACT

A method and apparatus to increase the effectiveness of a Magnetic Resonance Imaging (MRI) device by increasing the signal-to-noise ratio, allowing thinner slice thicknesses, and allowing more contiguous slices. In an MRI device, a patient is subjected to a constant magnetic field, and then RF pulses are used to excite the atoms in the body of the patient. The atoms release a corresponding RF signal when the atoms relax, which can be measured and mapped into a visual display. The RF pulses used to excite the atoms in the body of the patient use a modified Bessel function. The Bessel function having an approximately rectangular waveform in the frequency domain increases the signal-to-noise ratio, allows thinner slice thicknesses, and allows more contiguous slices, resulting in a better MR image and a more efficient MRI apparatus.

52 Claims, 16 Drawing Sheets

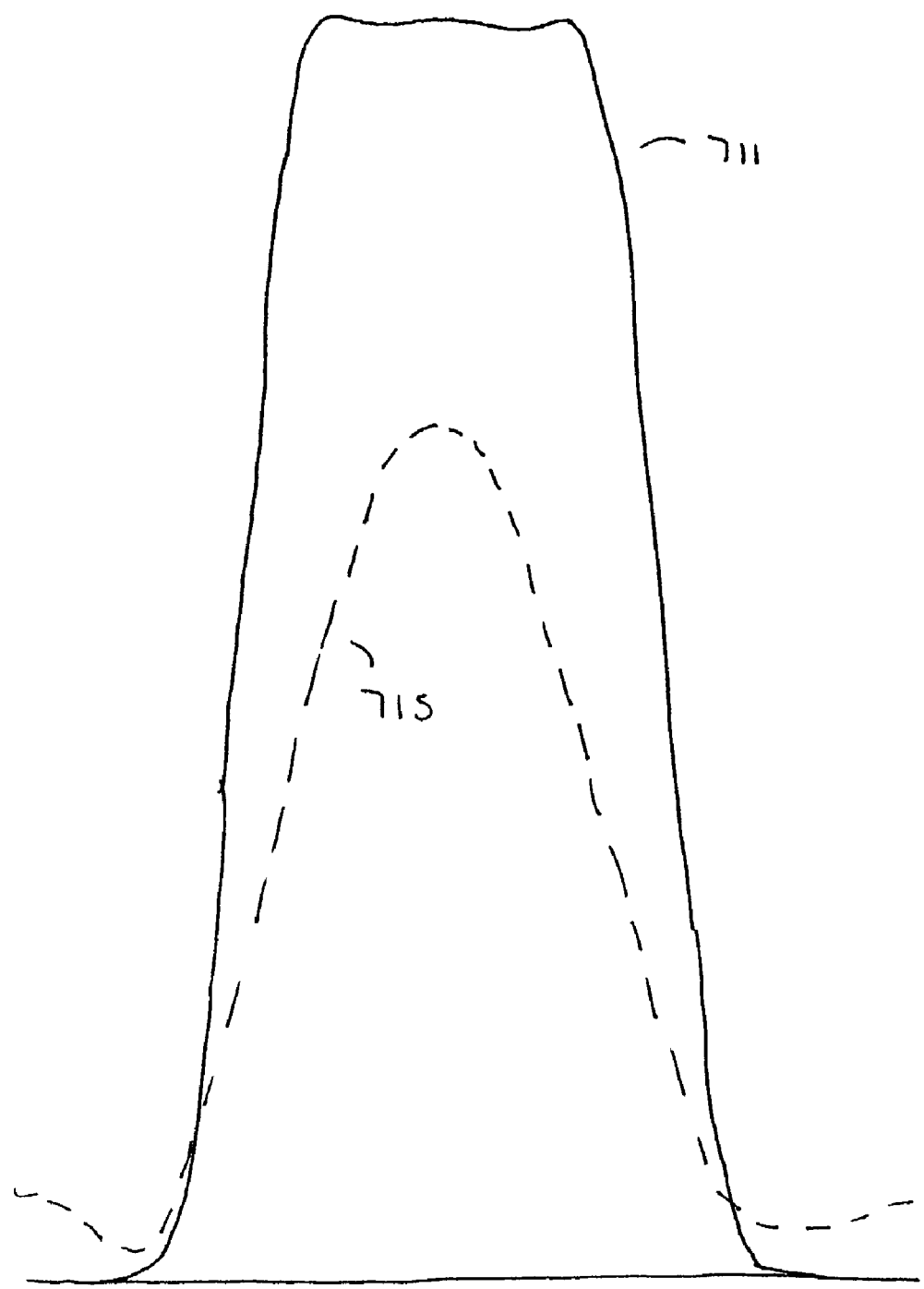

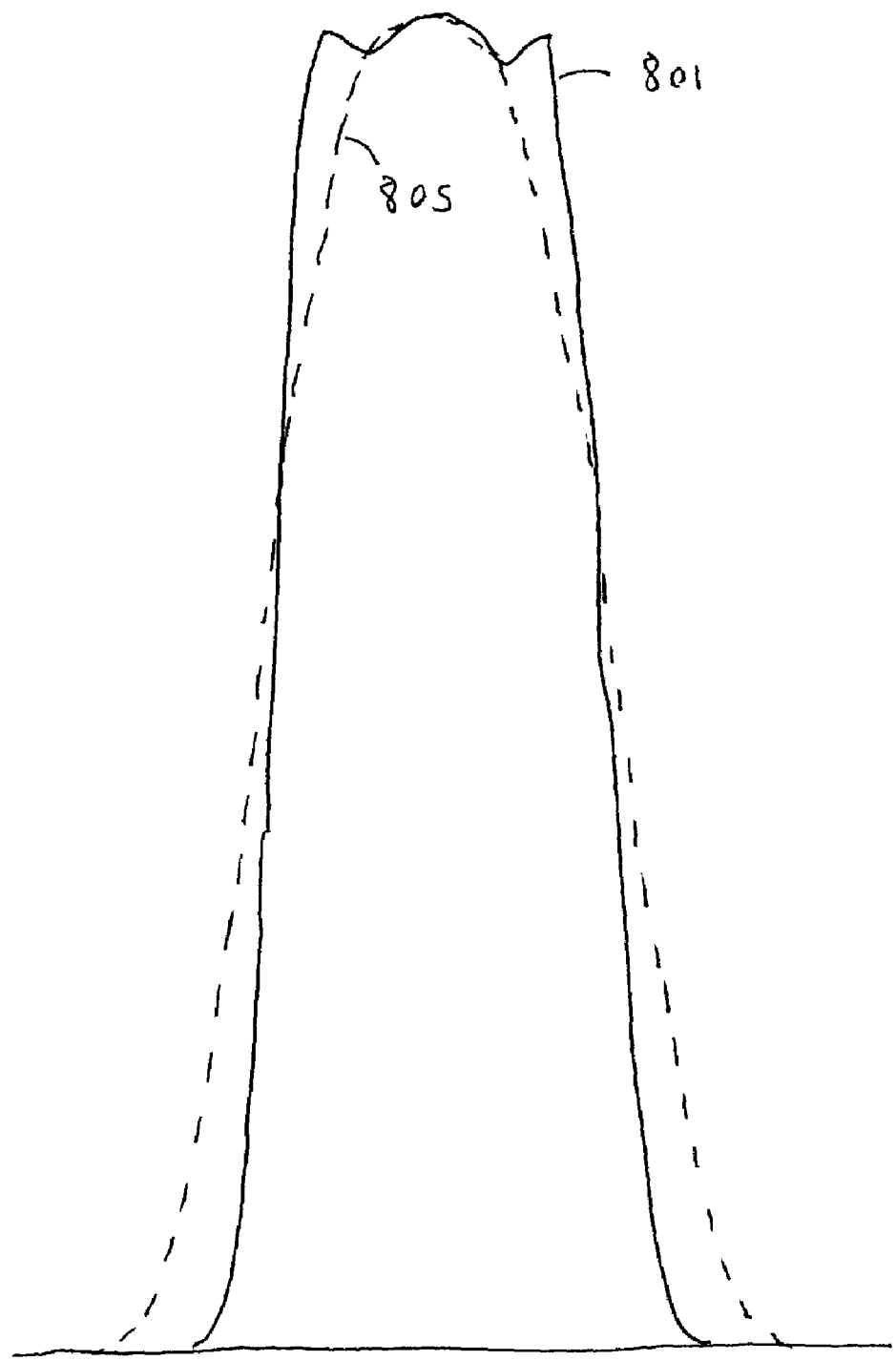

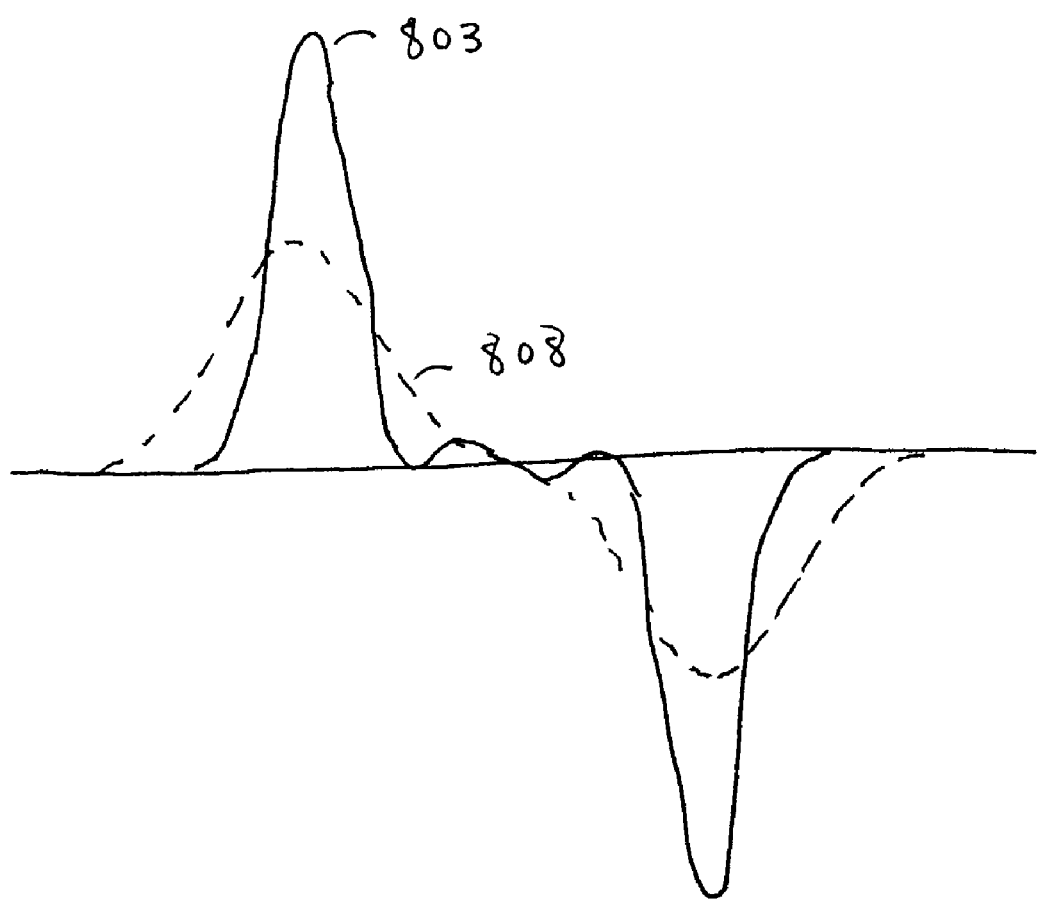

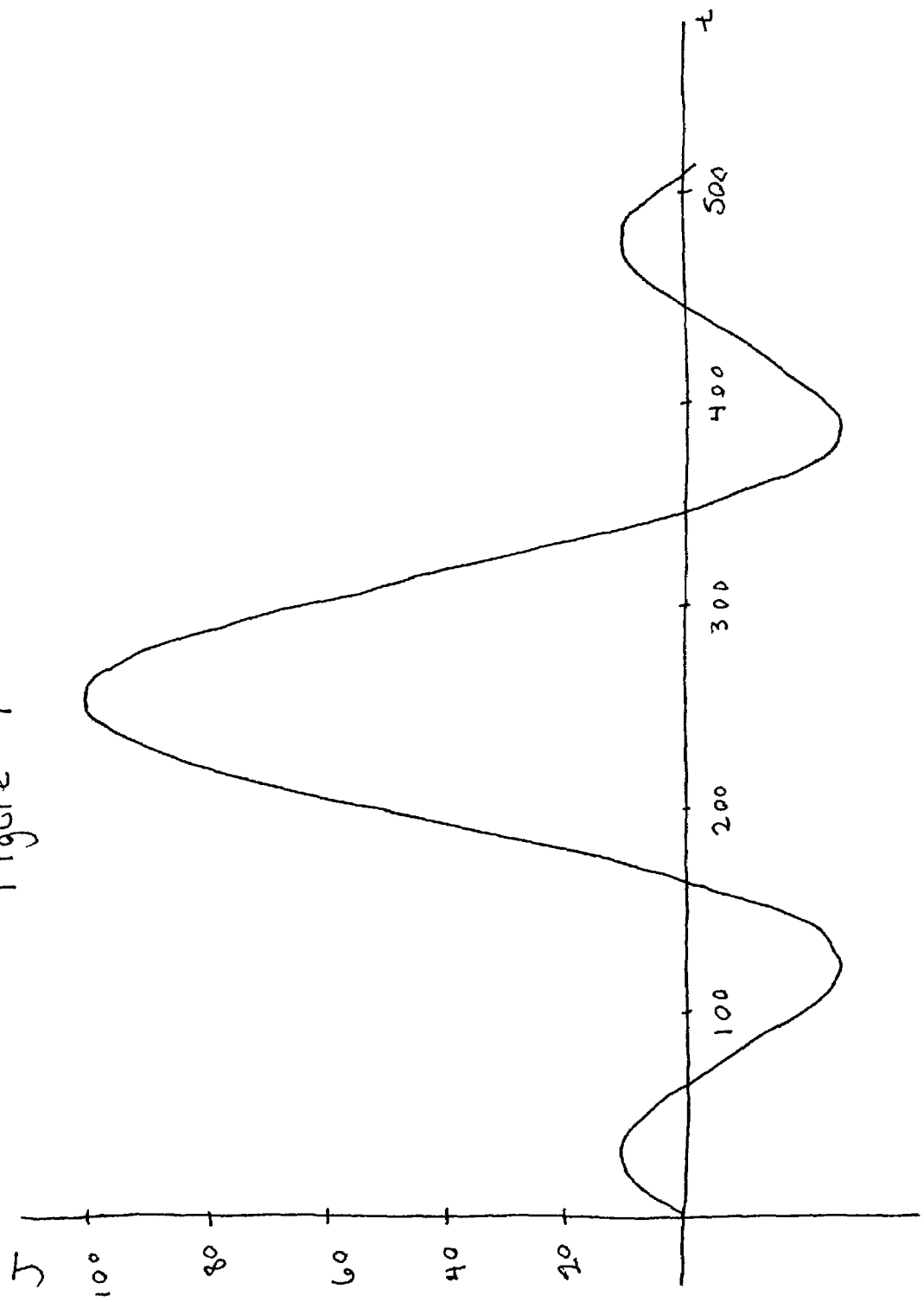

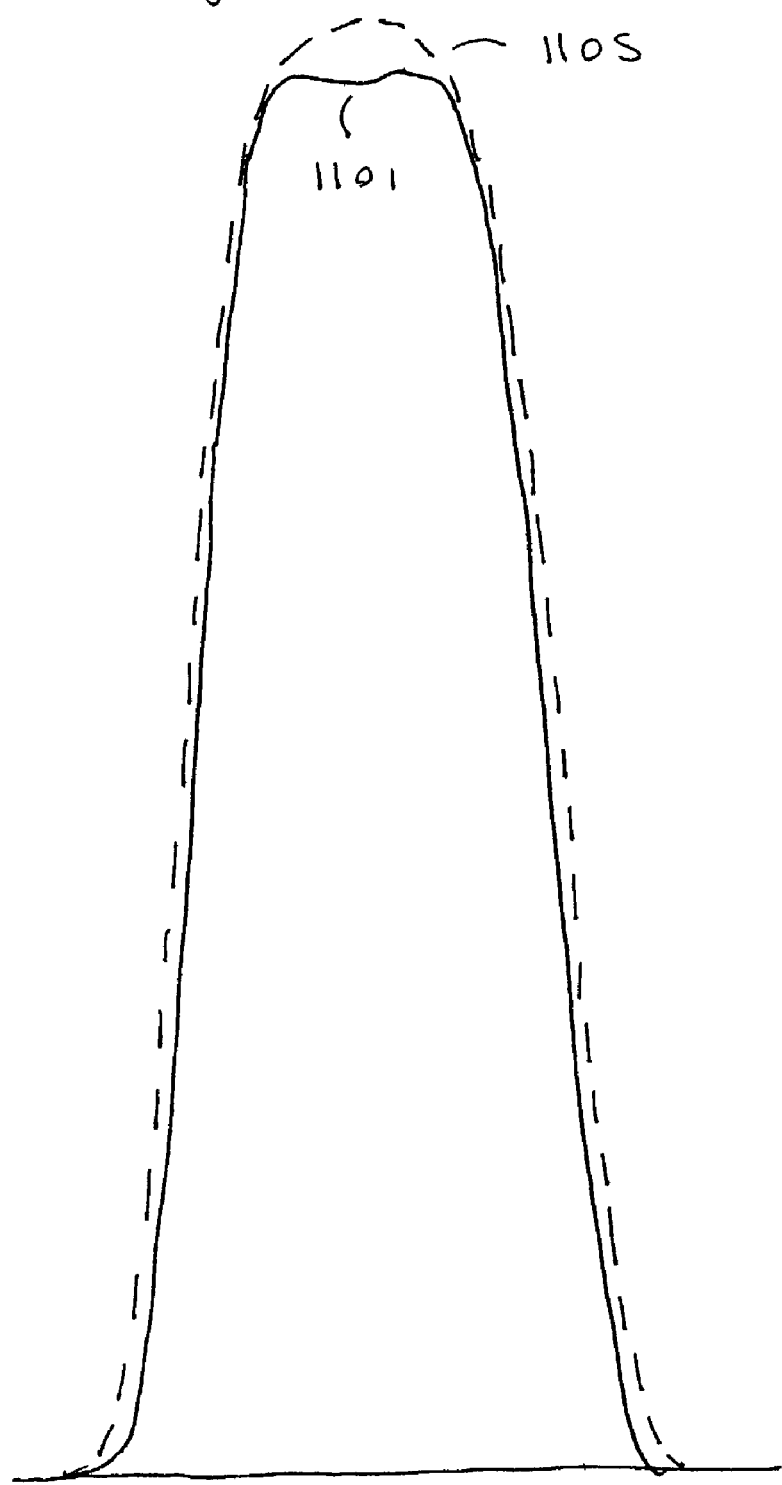

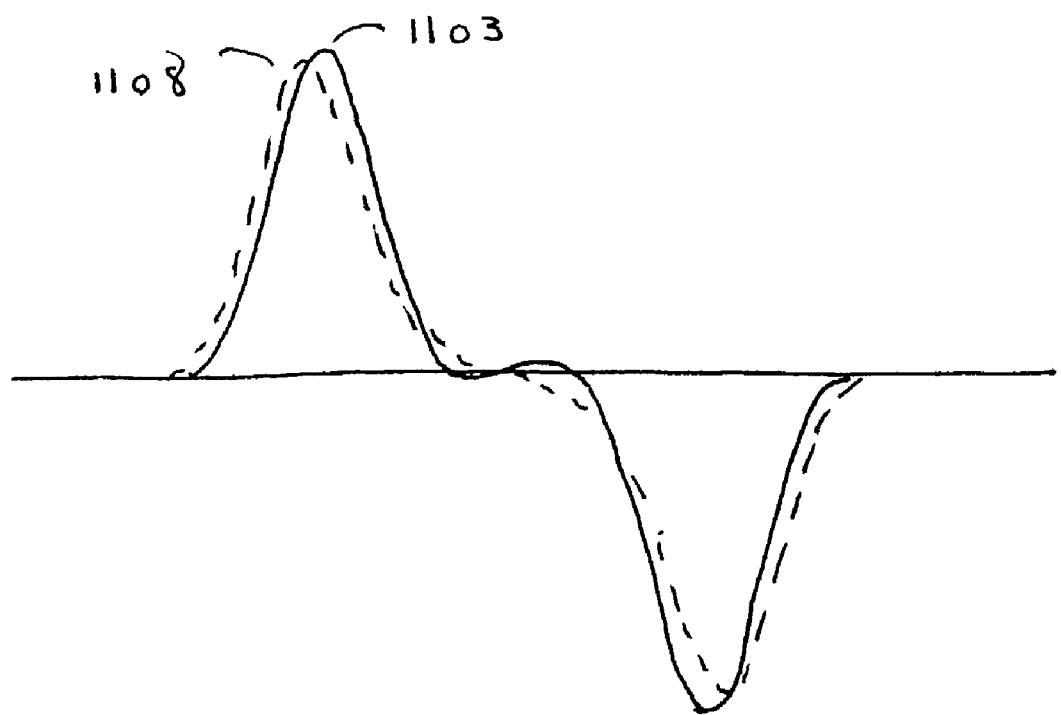

MAGNETIC RESONANCE IMAGING USING BESSEL FUNCTIONS

TECHNICAL FIELD

The technical field generally relates to magnetic resonance imaging techniques and more specifically to a method for improving the efficiency of a magnetic resonance imaging apparatus through particular RF pulses.

BACKGROUND

Magnetic resonance imaging (MRI), also called nuclear magnetic resonance (NMR) imaging, is a non-destructive method for the analysis of materials and is used extensively in medical imaging. It is completely non-invasive and does not involve ionizing radiation. In very general terms, nuclear magnetic moments are excited at specific spin precession frequencies which are proportional to the local magnetic field. The radio frequency (RF) signals resulting from the precession of these spins are received using pickup coils. By manipulating the magnetic fields, an array of signals is provided representing different regions of the volume. These are combined to produce a volumetric image of the nuclear spin density of the body.

In MRI, a body is subjected to a constant magnetic field. Another magnetic field, in the form of electromagnetic (RF) pulses, is applied orthogonally to the constant magnetic field. The RF pulses have a particular frequency that is chosen to affect particular atoms (typically hydrogen) in the body. The RF pulses excite the atoms, increasing the energy state of the atoms. After the pulse, the atoms relax and release RF emissions, corresponding to the RF pulses, which are measured and processed into images for display.

When hydrogen nuclei relax, the frequency that they transmit is positively correlated with the strength of the magnetic field surrounding them. A magnetic field gradient along the z-axis, called the "slice select gradient," is set up when the RF pulse is applied, and is shut off when the RF pulse is turned off. This gradient causes the hydrogen nuclei at the high end of the gradient (where the magnetic field is strong) to precess at a high frequency (e.g., 26 MHz), and those at the low end (weak field) to precess at a lower frequency (e.g., 24 MHz). When the RF pulse, of a single frequency, is applied, only those nuclei which precess at that frequency will be tilted, to later relax and emit a radio transmission (i.e., the nuclei "resonate" to that frequency). For example, if the magnetic gradient caused hydrogen nuclei to precess at rates from 24 MHz at the low end of the gradient to 26 MHz at the high end, and the gradient were set up such that the high end was located at the patient's head and the bottom part at the patient's feet, then a 24 MHz RF pulse would excite the hydrogen nuclei in a slice near the feet, and a 26 MHz pulse would excite them in a slice near the head. Thus a single "slice" along the z-axis is selected; only the protons in this slice are excited to a higher energy level, to later relax to a lower energy level and emit a radio transmission.

The second dimension of the image is extracted with the help of a phase encoding gradient. Immediately after the RF pulse ceases, all of the nuclei in the activated slice are in phase. Left to their own devices, these vectors would relax. In MRI, however, the phase encoding gradient (in the y-dimension) is briefly applied, in order to cause the magnetic vectors of nuclei along different portions of the gradient to have a different phase advance.

After the RF pulse, slice select gradient, and phase encoding gradient have been turned off, the MRI instrument sets up a third magnetic field gradient, along the x-axis, called the "frequency gradient" or "read-out gradient." This gradient causes the relaxing protons to differentially precess, so that the nuclei near the low end of the gradient begin to precess at a faster rate, and those at the high end pick up even more speed. When these nuclei relax again, the fastest ones (those which were at the high end of the gradient) will emit the highest frequency of radio waves. The frequency gradient is applied only when the signal is measured.

The second and third dimensions of the image are extracted by means of Fourier analysis. The entire procedure must be repeated multiple times in order to form an image with a good signal-to-noise ratio.

Finally, in spin-echo imaging, there is the problem that the inhomogeneity of the main magnetic field induces variations in the rate of precession of nuclei. To fix this problem, a 180° RF pulse is inserted into the cycle, at a time point halfway between the 90° pulse and the measurement of the radio transmission signal given off by the relaxing nuclei.

When 90° and 180° RF pulses are used, as described above, the technique is called "spin-echo imaging," and takes several minutes to create a single image. Other techniques which can be used in MRI include "gradient echo imaging," in which spin-echo's 180° pulse is replaced by a reversal of magnetic field gradients, "echo planar imaging," a variation of spin-echo (also called "fast spin-echo imaging"), and "spin-echo inversion recovery imaging."

MRI Techniques

In spin-echo imaging, an image section is defined by two RF pulses that are turned on following each other with a specified time interval. An echo signal is acquired once the same time interval has elapsed after the second RF pulse. The time between the first RF pulse and the signal is called the echo time TE. The echo signal results only when the tissue is exposed to both RF pulses, as is the case for stationary tissue. Blood flowing through the section will see the first pulse but move out of the section before the second RF pulse is given. Thus blood will give no signal or lower signal and appear darker than the surrounding tissue on the image. The intensity for blood is a function of the time TE/2 between the two pulses, the section thickness and the angle at which the blood flows through the section. For example, when the time between the pulses is 12.5 msec and the section thickness is 5 mm, blood entering the section perpendicular and moving with a velocity of 40 cm/sec will move completely out of the section in the 12.5 msec between the RF pulses and give no signal. Slower moving blood will move out only partially and appear with low but non-zero signal. Blood moving at an angle though the section, will take a longer time to traverse the section and may yield a non-zero signal.

Unlike spin-echo images, blood appears bright in fast gradient echo images. In gradient echo images, a stream of RF pulses is turned on in rapid time intervals with repetition times TR of 20–50 msec. When stationary tissue in an image section is exposed to this stream of RF pulses an equilibrium state is reached and results in a signal that is medium low (e.g., lower than the signal in spin-echo imaging). Moving blood enters the image section and is not exposed to the stream of RF pulses in the way the surrounding stationary tissue is. Thus moving blood gives a high signal. As in spin-echo imaging, the intensity of the blood signal depends on the section thickness, the velocity of the blood, the angle at which the blood enters the section and on the sequence acquisition parameters TR, TE and flip angle.

Physics of MRI

The proton nuclei of the hydrogen atom (and other atoms) possess a small magnetic moment. When placed within a magnetic field, a torque will be exerted upon them, resulting in a slight energetic advantage of one orientation (parallel to the field) over another (the anti-parallel orientation). Over time, random atomic collisions and other perturbations allow the complete system to reach a magnetic and thermal equilibrium with an excess of protons aligned with the magnetic field. The combined alignment of all of these protons results in a net magnetic moment; a subject placed within a magnetic field thus becomes "magnetized." In biological tissues, this magnetization is exceedingly small, and generally not observable. In addition to their magnetic moment, atomic nuclei possess angular momentum—a quantum property known as "spin." Because of this angular momentum, rather than aligning simply with magnetic fields, the individual nuclei precess about it, much as a spinning top or gyroscope might, when placed in the earth's gravitational field. The precessional rate, or frequency, is characteristic of the atomic nucleus (e.g., protons) and is proportional to the strength of the magnetic field, a property crucial to the process of image formation. With the magnetic field strengths in use for today's typical MRI machines, the precessional frequency is between 5 MHz and 200 MHz.

As shown in FIG. 1, the hydrogen proton 100 possesses the quantum property of "spin" or angular momentum 102, and has a small magnetic dipole moment 104. When placed in a magnetic field 106, a torque is exerted on the particle, causing it to precess about the applied field 108. The precessional frequency of the protons is directly proportional to the magnetic field strength. Protons precess at about 43 MHz/Tesla.

FIG. 2 shows that the proton magnetization can be decomposed into the sum of a stationary (longitudinal) 202 and a rotating (transverse) component 204. Each proton nucleus within a magnetic field thus yields a tiny field 206 that rotates about that applied field. The rotating field 206 from individual nuclei is generally aligned at random with respect to other protons in the subject or sample. In macroscopic systems, the average rotating field will effectively be zero, since that arising from any individual nucleus is canceled by another, oppositely oriented, neighbor.

In MR imaging, a second magnetic field is applied, which is orthogonal to the static field, and which rotates about the static field at the precessional frequency of the atomic nuclei. When the rotating field is present, the nuclei will precess about it, forcing the magnetization away from equilibrium, and causing the ensemble of protons to precess together, or in phase. The combined rotating magnetic moment thus produced by the ensemble of protons is observable as a time-varying electromagnetic signal. The second rotating magnetic field is applied at radio frequencies in the form of an RF pulse.

Two fundamental temporal parameters are used to describe the MR signal. The longitudinal relaxation rate, T1, is the rate at which nuclei, once placed in a magnetic field, exponentially approach thermal equilibrium, so that the magnetization (M) is described by the formula:

$$M = M_o(1 - e^{(-t/T1)}), \quad (1)$$

where $M_o$ is the equilibrium magnetization. In biological tissues, the proton T1 is quite long: from tens of milliseconds to seconds. Differences in the T1's of tissues are one of the primary bases of contrast in clinical MRI. A second parameter time constant describes the rate at which the MR signal decays. Once an MR signal is formed, i.e., after an RF pulse, it fades quickly; small variations in the local magnetic field, e.g., those caused by neighboring magnetic nuclei, cause the protons to precess at slightly different rates and therefore to become out of phase with one another. Interactions among the magnetized protons, and motion in inhomogeneous fields, due for example to diffusion, also results in signal dephasing. The observed signal decay rate, (T2*) generally ranges from a few milliseconds to tens of milliseconds and, to a reasonable approximation, also follows first order kinetics. The MR signal, S(t), signal decays according to the formula:

$$S(t) = S_o(e^{(-t/T2*)}) \quad (2)$$

where $S_o$ is the signal strength immediately following the RF excitation pulse. The observed T2* decay is the net effect of all the dephasing terms:

$$1/T2* = 1/T2 + 1/T2m + 1/T2D + \text{other terms}, \quad (3)$$

where T2m represents the dephasing due to magnetic field inhomogeneities and T2D is the diffusion-related signal loss. Like T1, the T2 signal decay rates differ among body tissues. By waiting for a period TE following the RF excitation pulse, differences in the signal decay rate will become evident as differences in the MR signal intensity: tissues with longer T2's will have stronger signals than those with short T2's, whose signals decay more rapidly. Modifications to the pattern of RF excitation (the "pulse sequence") can modulate the contributions of the various relaxation processes to the resulting MR signal. In particular a spin-echo pulse sequence can be used to nearly eliminate the T2m contribution, increasing the relative contributions of other terms, such as proton diffusion, to the image contrast.

In each MRI technique, various parameters such as T1, T2, and T2* can be manipulated to increase or decrease the weight or value of the parameter in the MR image. However, each technique is affected by certain harmful physical characteristics, affecting signal-to-noise ratio, SNR. Each technique benefits from increasing SNR.

SUMMARY

The present invention provides a method and apparatus to increase the effectiveness of a Magnetic Resonance Imaging (MRI) device by increasing the signal-to-noise ratio, allowing thinner slice thicknesses, and allowing more contiguous slices. In an MRI device, a patient is subjected to a constant magnetic field, and then RF pulses are used to excite the atoms in the body of the patient. The atoms release a corresponding RF signal when the atoms relax, which can be measured and mapped into a visual display. The RF pulses used to excite the atoms in the body of the patient use a modified Bessel function. The Bessel function having an approximately rectangular waveform in the frequency domain increases the signal-to-noise ratio, allows thinner slice thicknesses, and allows more contiguous slices, resulting in a better MR image and a more efficient MRI apparatus.

BRIEF DESCRIPTION OF THE DRAWINGS

The features, aspects, and advantages of the present invention will become better understood with regard to the following description, appended claims, and accompanying drawings where:

FIG. 7b illustrates the first derivatives of the waveforms of the graph of the frequency domain of FIG. 7a;

FIG. 7c illustrates a graph of the frequency domain of the Bessel function and gaussian function pulse of 5 msec, TE=30 msec;

FIG. 8a illustrates a graph of the frequency domain of the Bessel function and sinc function pulse of 5 msec, TE=20 msec;

FIG. 8b illustrates the first derivatives of the waveforms of the graph of the frequency domain of FIG. 8a;

FIG. 9 illustrates a plot of the 5 msec 90° Bessel function pulse;

FIG. 11a illustrates a graph of the frequency domain of the Bessel function and sinc function pulse of 3 msec, TE=15 msec; and FIG. 11b illustrates the first derivatives of the waveforms of the graph of the frequency domain of FIG. 11a.

DETAILED DESCRIPTION

The following detailed description is presented to enable any person skilled in the art to make and use the invention. For purposes of explanation, specific nomenclature is set forth to provide a thorough understanding of the present invention. However, it will be apparent to one skilled in the art that these specific details are not required to practice the invention. Descriptions of specific applications are provided only as representative examples. Various modifications to the preferred embodiments will be readily apparent to one skilled in the art, and the general principles defined herein may be applied to other embodiments and applications without departing from the scope of the invention. The present invention is not intended to be limited to the embodiments shown, but is to be accorded the widest possible scope consistent with the principles and features disclosed herein.

Figure 1:
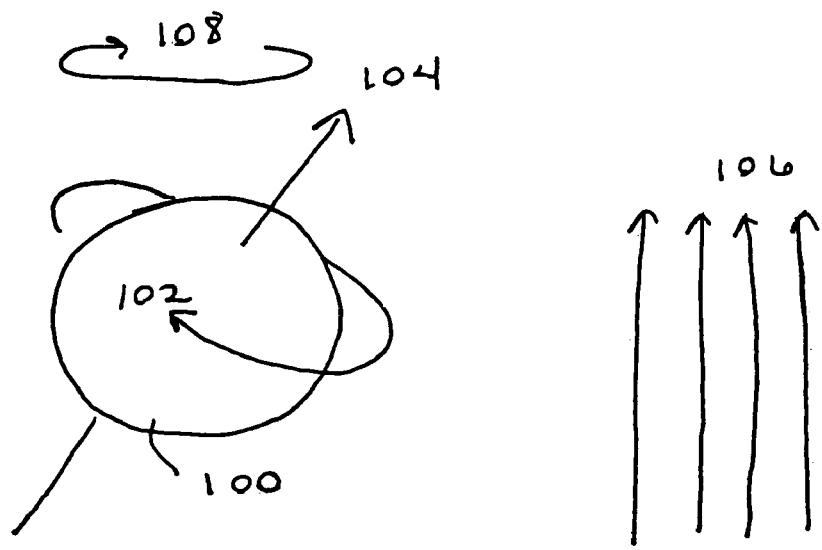
FIG. 1 illustrates the magnetic precession of a hydrogen proton.
Figure 2:
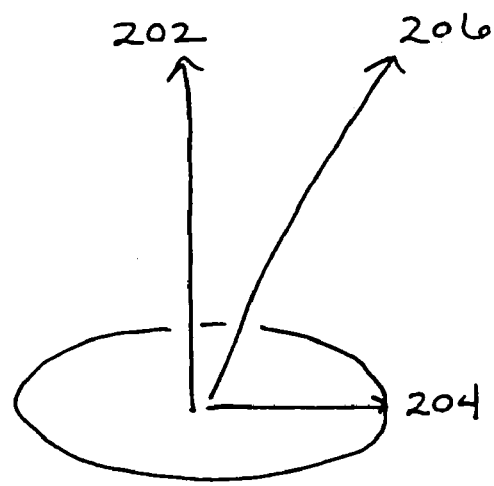
FIG. 2 illustrates the components of the magnetic dipole of the hydrogen proton.
Figure 3:
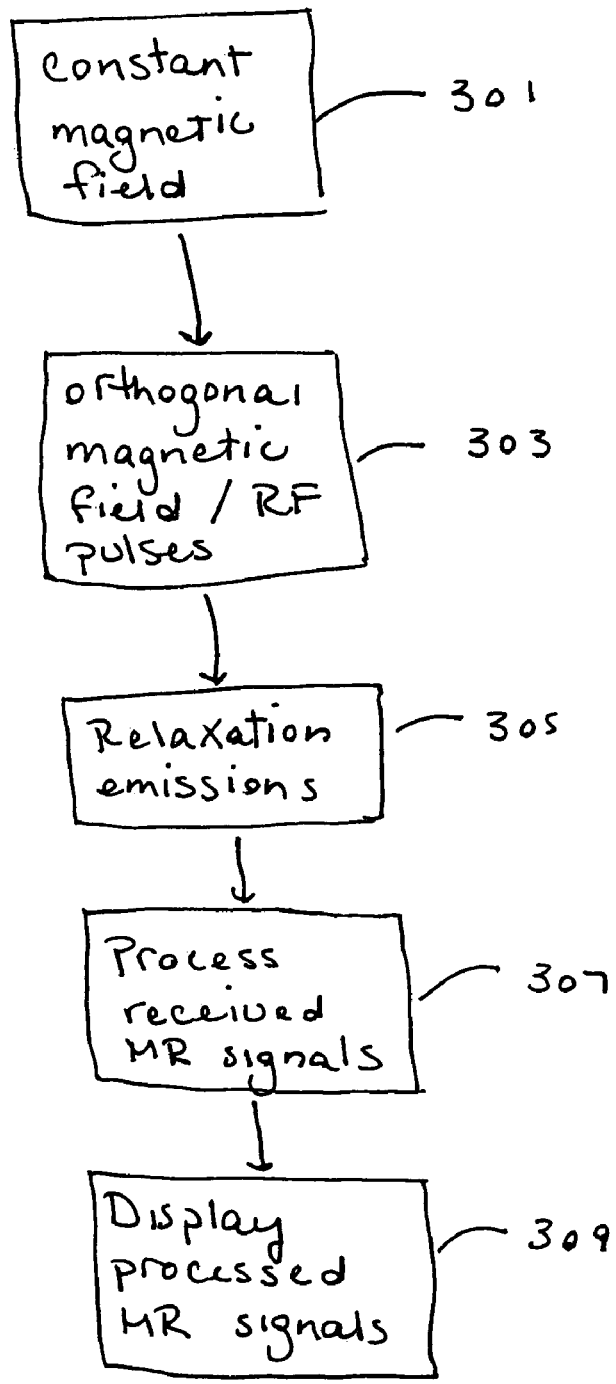
FIG. 3 illustrates a flowchart showing the operation of an MR imaging apparatus.

As shown in the flowchart of FIG. 3, in MRI, a body is subjected to a constant magnetic field 301. RF pulses 303 are applied to the constant magnetic field. The RF pulses excite the atoms, increasing the energy state of the atoms. After the pulse, the atoms relax and release a corresponding RF pulse 305 which is processed 307 and displayed 309.

Figure 4:
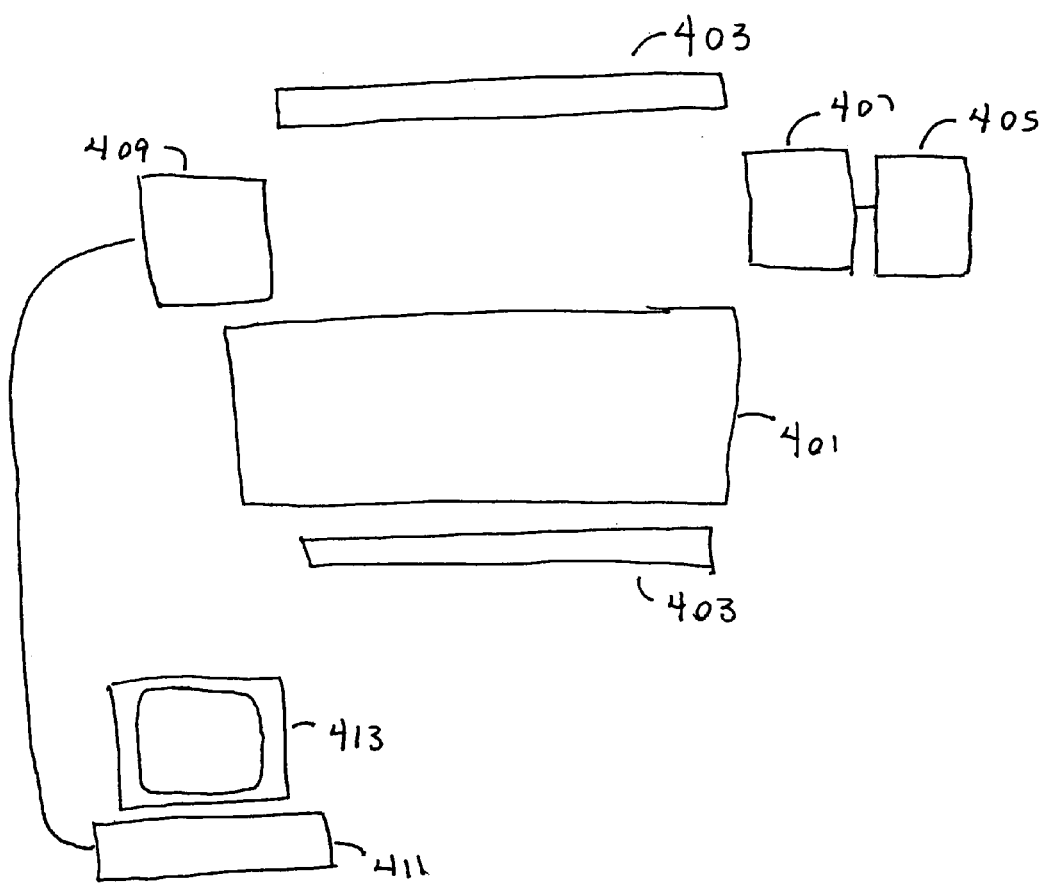
FIG. 4 illustrates an MRI machine.

A physical apparatus is shown in FIG. 4. An MRI apparatus has a bed 401, where the object being examined is placed. The object may be a physical culture, a person, an animal, or any other physical object. The bed 401 is surrounded by magnetic coils 403, which generate the constant magnetic field 301 of FIG. 3. An RF signal generator 405 creates the RF pulses 303 transmitted by the antenna 407 that excite the atoms of the object being examined, and an RF coil 409 receives the relaxation RF signals from the atoms in the object. Typically, the atoms are hydrogen atoms, but may be any other atom. For example, the atoms may be $^1H$, $^3He$, $^{13}C$, $^{15}N$, $^{17}O$, $^{19}F$, $^{23}Na$, $^{31}P$, $^{31}K$, $^{65}Cu$, or $^{129}Xe$. A processor 411 processes the received RF emission signals and displays the information on a monitor 413

In MRI it is necessary to use RF pulses such that the slice profile of the images is a close approximation to a rectangle. Ideally, the slice profile of interest has a very particular gradient and an approximately rectangular slice profile is preferred. However, because the slice profile is less-than-ideally rectangular, a more rectangular slice profile is preferred. Although a perfectly rectangular slice profile is very difficult to achieve, a method is presented in which Bessel functions can be used in the design of RF pulses that offer improved slice profiles compared to those of the widely used sinc, cosine, and gaussian functions. The RF pulses constructed from Bessel functions improve the image slice profile without reducing SNR and without increasing RF or gradient peak amplitudes. The pulses also allow thinner slice thicknesses, and allow more contiguous slices, which reduces the inefficiencies of either gaps or overlaps between adjacent image slices.

The Bessel function of the First Kind of order n for integer values of $n \geq 0$ is $$J_n(t) = t^n \sum_{m=0}^{\infty} \frac{(-1)^m t^{2m}}{2^{2m+n}(m!)(n+m)!} \qquad (4)$$

where t is time and m is an integer. For n=0, the Bessel function of the First Kind of order zero is $$J_o(t) = \sum_{m=0}^{\infty} \frac{(-1)^m t^{2m}}{2^{2m}(m!)(m!)}. \qquad (5)$$

Expanding equation (5) for m=0 . . . 9 yields $$J_o(t) = 1 - \frac{t^2}{2^2} + \frac{t^4}{2^4(2!)^2} - \frac{t^6}{2^6(3!)^2} + \frac{t^8}{2^8(4!)^2} - \qquad (6)$$
$$\frac{t^{10}}{2^{10}(5!)^2} + \frac{t^{12}}{2^{12}(6!)^2} - \frac{t^{14}}{2^{14}(7!)^2} + \frac{t^{16}}{2^{16}(8!)^2} - \frac{t^{18}}{2^{18}(9!)^2}.$$

Figure 5:
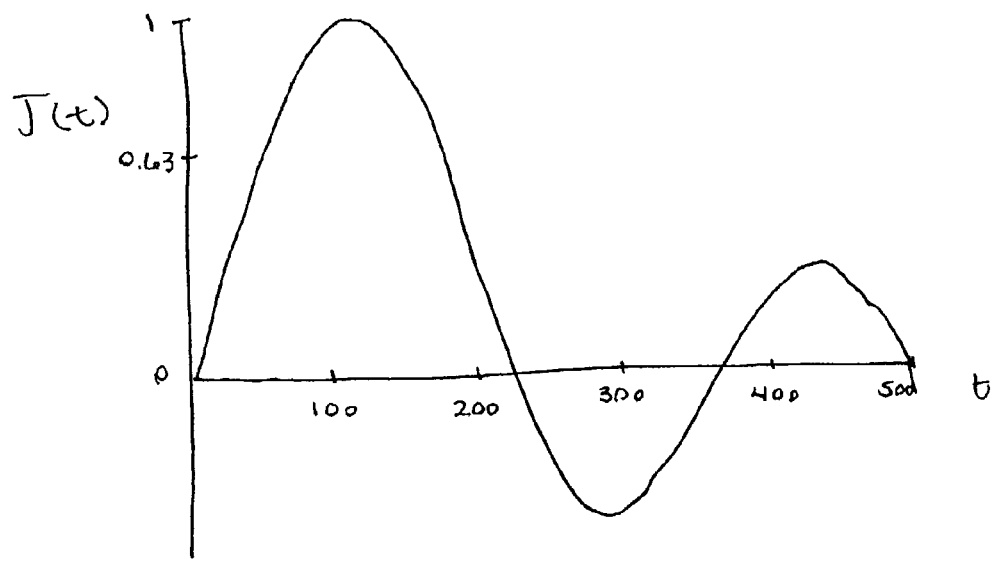
FIG. 5 illustrates a Bessel function waveform.

The oscillatory character of this function is shown in FIG. 5. To control the zero crossings or equivalently to control the number of lobes, equation (6) is modified by introducing a constant, q, as $$J_o(t, q) = 1 - \frac{t^2}{2^2(-q)} + \frac{t^4}{2^4(2!)^2(q)^2} - \frac{t^6}{2^6(3!)^2(-q)^3} + \qquad (7)$$

-continued
$$\frac{t^8}{2^8(4!)^2(q)^4} - \frac{t^{10}}{2^{10}(5!)^2(-q)^5} + \frac{t^{12}}{2^{12}(6!)^2(q)^6} -$$
$$\frac{t^{14}}{2^{14}(7!)^2(-q)^7} + \frac{t^{16}}{2^{16}(8!)^2(q)^8} - \frac{t^{18}}{2^{18}(9!)^2(-q)^9}.$$

Figure 6:
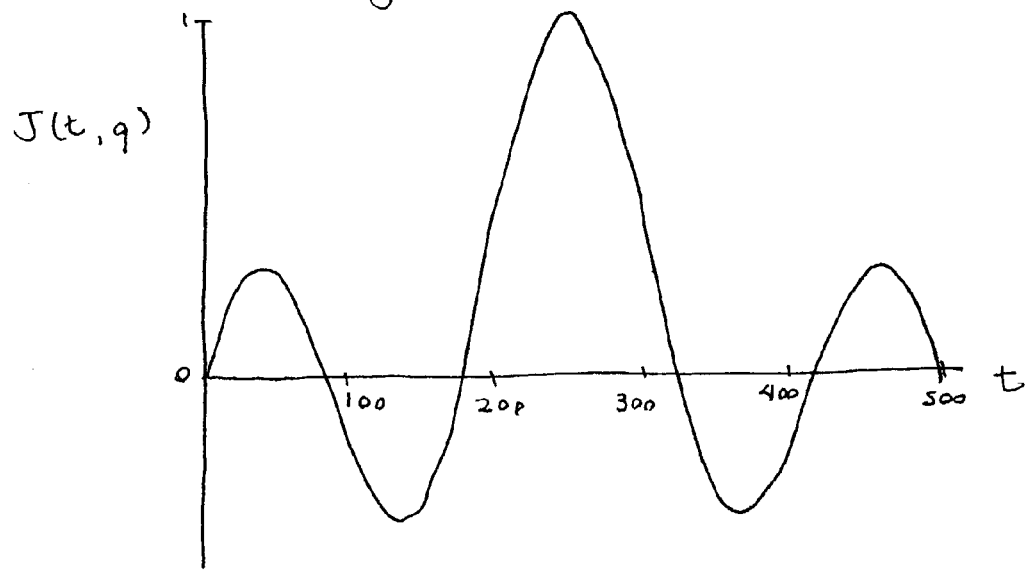
FIG. 6 illustrates a Bessel function waveform of FIG. 5 with an added constant q, as used in the method and apparatus of the present invention.

The character of this function is shown in FIG. 6. To control the peak amplitudes of the lobes, equation (7) is multiplied by a cosine function of a certain frequency, $\omega$. The equation $C(t)$ is defined to be $C(t)=\cos(\omega t)$. This has a modulating effect on the Bessel function, as shown in equation (8).

$$K(t)=G*\{G_1*J_o(t,q)*G_2*C(t)\} \quad (8)$$

G is a multiplication factor used to calibrate the amplitude of $K(t)$. $G_1$ and $G_2$ are percent amplitudes of each component function. For some applications, the cosine function in equation (8) is replaced by another Bessel function $J_o(t,Q)$ of a different constant, Q.

$$L_1(t)=G*\{G_1*J_o(t,q)*G_2*J_o(t,Q)\} \quad (9)$$

Furthermore, for other applications, a superposition of a Bessel function, $J_o(t,Q)$ on the composite function (8) works very well. As shown, the superposition is $$L_2(t)=G*\{G_1*J_o(t,q)*C(t)+G_2*J_o(t,Q)\} \quad (10)$$

Using the currently preferred equation (10) to design excitation pulses of various flip angles (5° to 90°) and 180° inversion pulses of RF durations ranging from 1 msec to 8 msec produced various experimental results. Experimental results are shown for 90° excitation and 180° inversion pulses with spin-echo sequences.

The parameter values listed below were calculated empirically to be the values in the time domain that produce a good approximation of a square wave in the frequency domain for the particular values used.

For 5 msec 90° RF pulses the following values are examples of parameters used:

| q | Q | $\omega$ | G | $G_1$ | $G_2$ |
|---|---|---|---|---|---|
| $-0.24 * 10^{-6}$ | 0.0 | $0.4 * 10^{-3}$ | 55.0 | 1.0 | 1.0 |

For 5 msec 180° RF pulses the following values are examples of parameters used:

| q | Q | $\omega$ | G | $G_1$ | $G_2$ |
|---|---|---|---|---|---|
| $-0.21 * 10^{-6}$ | $-0.09 * 10^{-6}$ | $0.4 * 10^{-3}$ | 100.0 | 1.2 | 0.8 |

These 5 msec Bessel function RF pulses were used in spin-echo sequences of different echo times TE to obtain MR images of phantom slices containing water doped with NiCl. The slice profiles of those images was measured and compared to the slice profile of sinc and gaussian RF pulses.

Figure 7A:
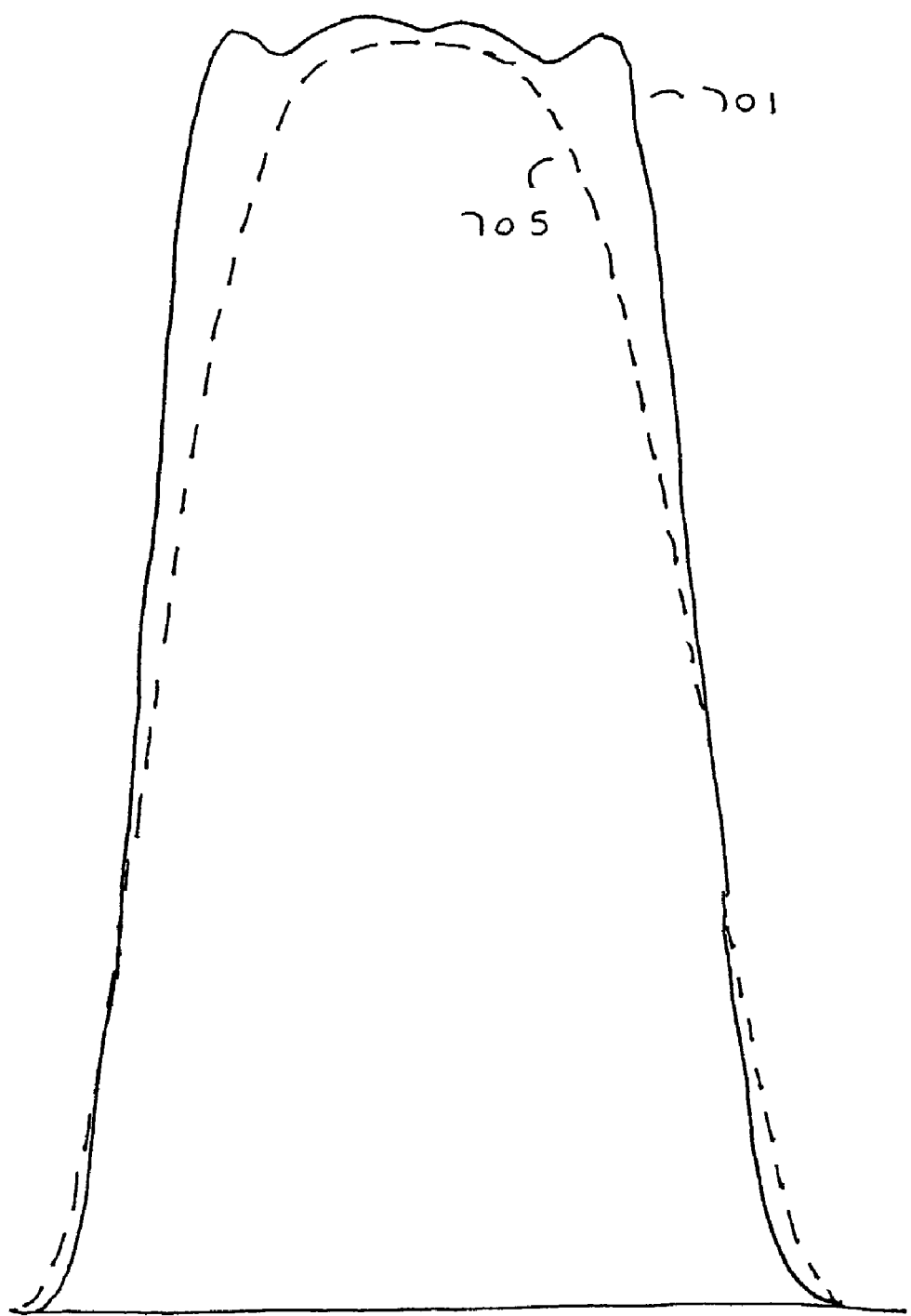
FIG. 7a illustrates a graph of the frequency domain of the Bessel function and sinc function pulse of 5 msec, TE=30 msec.

Shown in FIG. 7a is the slice profile 701 obtained with a Bessel function of a spin echo TE=30 msec. The measured slice thickness is very close to the calculated (from sequence parameters) slice thickness, between 7 and 8 mm. The slice thickness is measured, as is known in the art, as the distance between the half-maximum points of the intensity curve. Also shown is the same slice profile 705 obtained with a sinc function. The steeper slopes of the slice profile 701 show clearly that the profile 701 is more rectangular than the corresponding profile 705. In this graph, the x-axis is distance and the y-axis is intensity.

Shown in FIG. 7b is the first derivative 703 of the slice profile 701 obtained with a Bessel function and the first derivative 708 of the slice profile 705 obtained with a sinc function. The graph of the first derivatives more clearly shows the differences in slope of the slice profiles 701 and 705 obtained with the Bessel function and sinc function. The slope 703 of the slice profile 701 is clearly steeper than the slope 708 of the slice profile 705, which is also an indication that the slice profile 701 is more rectangular than the slice profile 705.

Shown in FIG. 7c is the slice profile 711 obtained with a Bessel function of a spin echo TE=30 msec. Also shown is the same slice profile 715 obtained with a gaussian function. The steeper slopes of the slice profile 711 show clearly that the profile 711 is more rectangular than the corresponding profile 715. In this graph, as in FIG. 7a, the x-axis is distance and the y-axis is intensity.

Figure 7D:
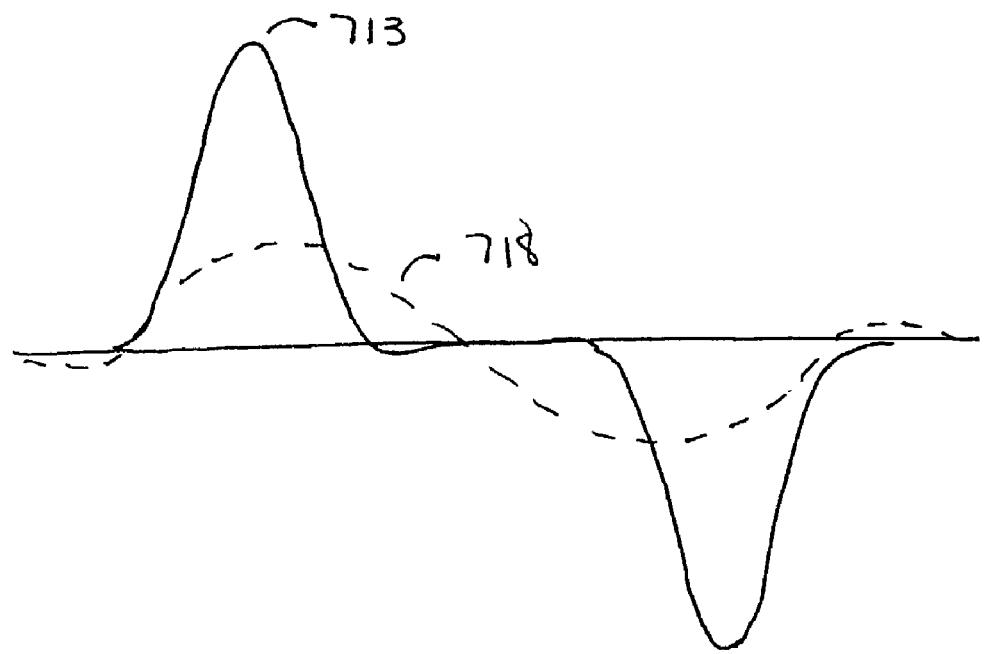
FIG. 7d illustrates the first derivatives of the waveforms of the graph of the frequency domain of FIG. 7c.

Shown in FIG. 7d is the first derivative 713 of the slice profile 711 obtained with a Bessel function and the first derivative 718 of the slice profile 715 obtained with a gaussian function. The graph of the first derivatives more clearly shows the differences in slope of the slice profiles 711 and 715 obtained with the Bessel function and gaussian function. The slope 713 of the slice profile 711 is clearly steeper than the slope 718 of the slice profile 715, which is also an indication that the slice profile 711 is more rectangular than the slice profile 715.

Shown in FIG. 8a is the slice profile 801 obtained with a Bessel function with a TE=20 msec. Also shown is the same slice profile 805 obtained with a sinc function. The steeper slopes of the slice profile 801 show clearly that the profile 801 is more rectangular than the corresponding profile 805. As in FIG. 7a, in this graph, the x-axis is distance and the y-axis is intensity.

Shown in FIG. 8b is the first derivative 803 of the slice profile 801 obtained with a Bessel function and the first derivative 808 of the slice profile 805 obtained with a sine function. The graph of the first derivatives more clearly shows the differences in slope of the slice profiles 801 and 805 obtained with the Bessel function and sine function. The slope 803 of the slice profile 801 is clearly steeper than the slope 808 of the slice profile 805, which is also an indication that the slice profile 801 is more rectangular than the slice profile 805.

Figure 8C:
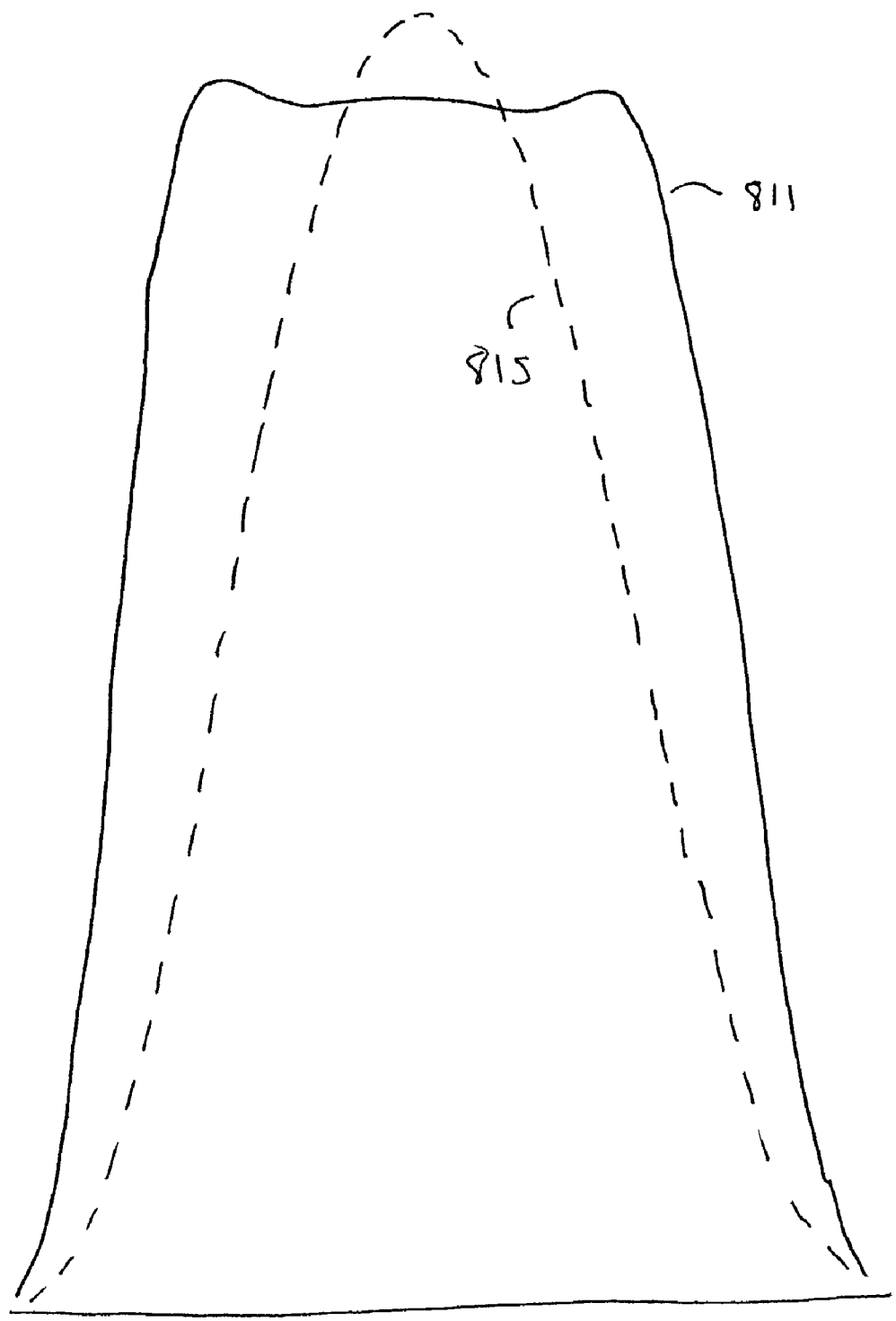
FIG. 8c illustrates a graph of the frequency domain of the Bessel function and gaussian function pulse of 5 msec, TE=20 msec.

Shown in FIG. 8c is the slice profile 811 obtained with a Bessel function with a TE=20 msec. Also shown is the same slice profile 815 obtained with a gaussian function. The steeper slopes of the slice profile 811 show clearly that the profile 811 is more rectangular than the corresponding profile 815. As in FIG. 8a, in this graph the x-axis is distance and the y-axis is intensity.

Figure 8D:
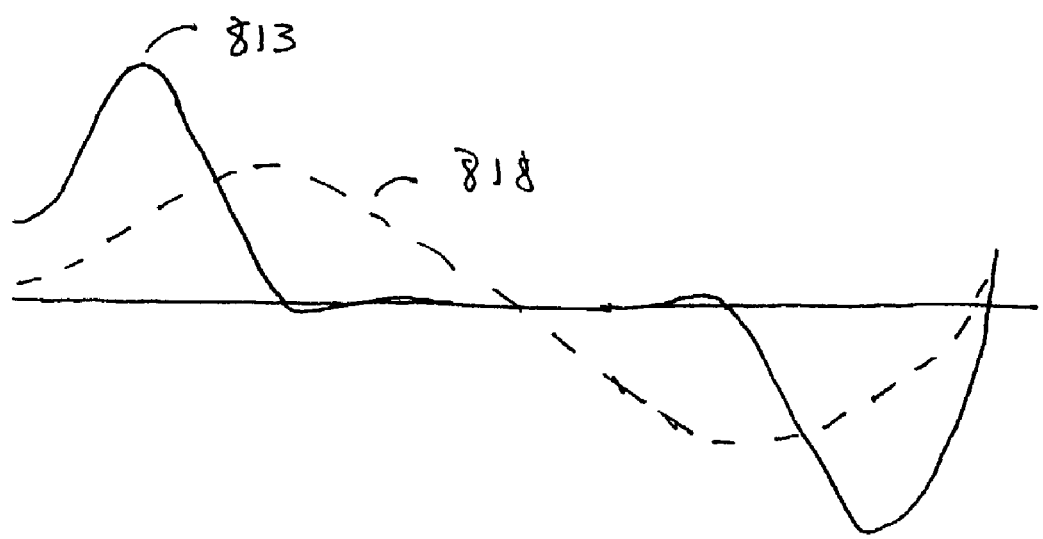
FIG. 8d illustrates the first derivatives of the waveforms of the graph of the frequency domain of FIG. 8c.

Shown in FIG. 8d is the first derivative 813 of the slice profile 811 obtained with a Bessel function and the first derivative 818 of the slice profile 815 obtained with a gaussian function. The graph of the first derivatives more clearly shows the differences in slope of the slice profiles 811 and 815 obtained with the Bessel function and gaussian function. The slope 813 of the slice profile 811 is clearly steeper than the slope 818 of the slice profile 815, which is also an indication that the slice profile 811 is more rectangular than the slice profile 815.

Figure 10:
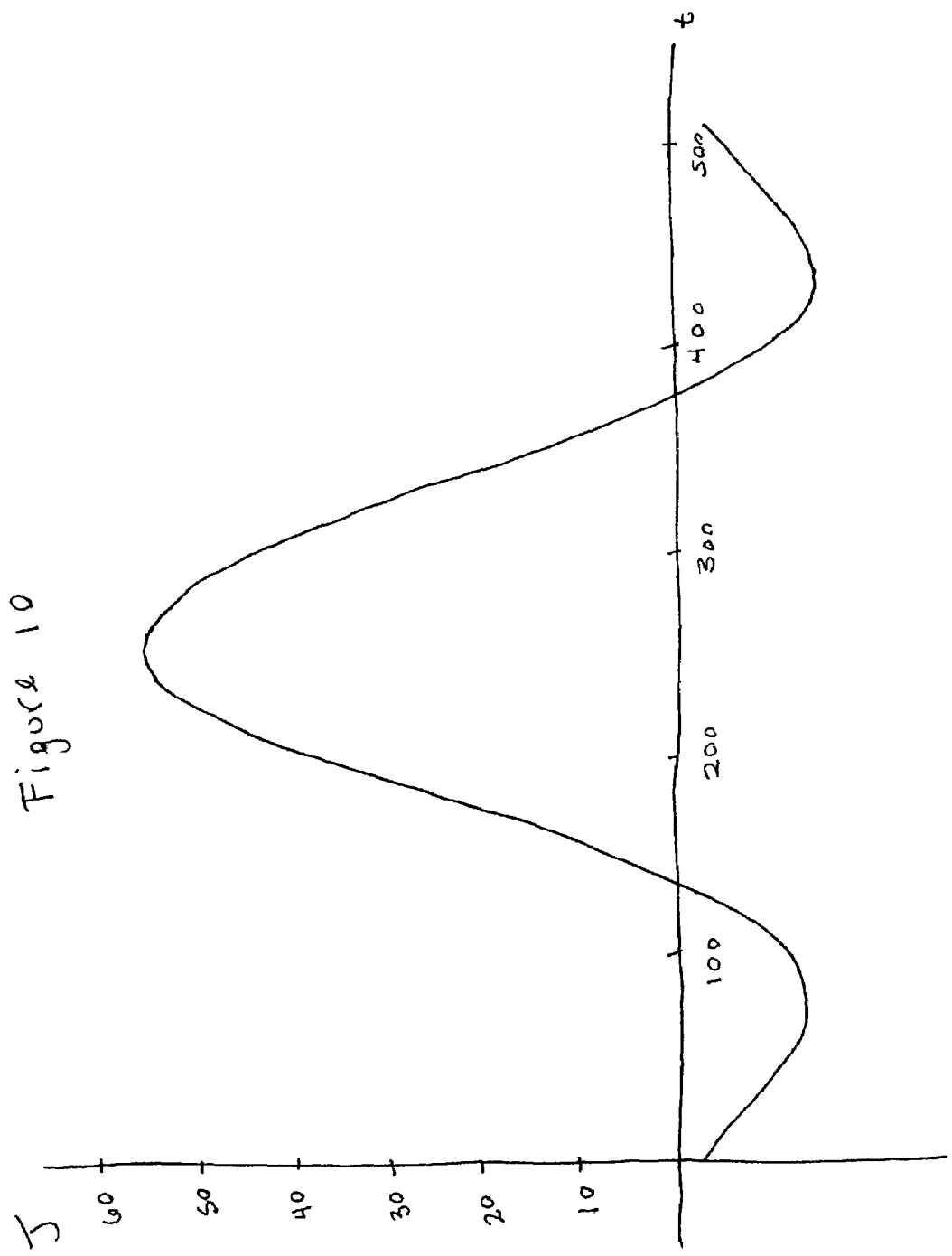
FIG. 10 illustrates a plot of the 5 msec 180° Bessel function pulse.

Shown in FIGS. 9 and 10 are plots of the 5 msec pulses with the above parameters. FIG. 9 shows a plot of the 90° 5 msec waveform, and FIG. 10 shows a plot of the 180° 5 msec waveform.

The parameter values listed below were calculated empirically to be the values in the time domain that produce a good approximation of a square wave in the frequency domain.

For 3 msec 90° RF pulses the following values were used:

| q | Q | ω | G | $G_1$ | $G_2$ |
|---|---|---|---|---|---|
| $-0.23 * 10^{-6}$ | 0.0 | $0.4 * 10^{-3}$ | 55.0 | 1.0 | 1.0 |

For 3 msec 180° RF pulses the following values were used:

| q | Q | ω | G | $G_1$ | $G_2$ |
|---|---|---|---|---|---|
| $-0.21 * 10^{-6}$ | $-0.09 * 10^{-6}$ | $0.4 * 10^{-3}$ | 100.0 | 1.2 | 0.8 |

Shown in FIG. 11a is the slice profile 1101 obtained with a Bessel function with a TE=15 msec. Also shown is the same slice profile 1105 obtained with a gaussian function. The steeper slopes of the slice profile 1101 show clearly that the profile 1101 is more rectangular than the corresponding profile 1105. As in FIGS. 7a, 7c, 8a, and 8c, in this graph the x-axis is distance and the y-axis is intensity.

Shown in FIG. 11b is the first derivative 1103 of the slice profile 1101 obtained with a Bessel function and the first derivative 1108 of the slice profile 1105 obtained with a gaussian function. The graph of the first derivatives more clearly shows the differences in slope of the slice profiles 1101 and 1105 obtained with the Bessel function and gaussian function. The slope 1103 of the slice profile 1101 is clearly steeper than the slope 1108 of the slice profile 1105, which is also an indication that the slice profile 1101 is more rectangular than the slice profile 1105.

It should be understood that although the currently preferred embodiment of the invention employs a modified Bessel function of the First Kind of order zero, other Bessel functions may be employed in practicing the principles of the present invention.

The foregoing description of the present invention provides illustration and description, but is not intended to be exhaustive or to limit the invention to the precise one disclosed. Modifications and variations are possible consistent with the above teachings or may be acquired from practice of the invention. Thus, it is noted that the scope of the invention is defined by the claims and their equivalents.

What is claimed is:

1. A method of examining an object using magnetic resonance imaging data, said method comprising the steps of:
    subjecting said object to a constant magnetic field;
    exciting atoms in said object within said constant magnetic field with a radio frequency waveform created from a modified Bessel function; and
    measuring relaxation magnetic resonance signals from said atoms,
    wherein said radio frequency waveform created from said modified Bessel function comprises a substantially rectangular waveform in the frequency domain.

2. The method according to claim 1, further comprising the steps of:
    processing said relaxation magnetic resonance signals into viewable information; and
    displaying said viewable information.

3. The method according to claim 1, wherein said atoms are $^1H$ atoms.

4. The method according to claim 1, wherein said atoms are chosen from the group consisting of $^3He$, $^{13}C$, $^{15}N$, $^{17}O$, $^{19}F$, $^{23}Na$, $^{31}P$, $^{31}K$, $^{65}Cu$, and $^{129}Xe$.

5. The method according to claim 1, wherein said Bessel function is a Bessel function of the First Kind of order zero.

6. The method according to claim 5, wherein said modified Bessel function is defined by the formula:

$$J_o(t, q) = 1 - \frac{t^2}{2^2(-q)} + \frac{t^4}{2^4(2!)^2(q)^2} - \frac{t^6}{2^6(3!)^2(-q)^3} + \frac{t^8}{2^8(4!)^2(q)^4} - \frac{t^{10}}{2^{10}(5!)^2(-q)^5} + \frac{t^{12}}{2^{12}(6!)^2(q)^6} - \frac{t^{14}}{2^{14}(7!)^2(-q)^7} + \frac{t^{16}}{2^{16}(8!)^2(q)^8} - \frac{t^{18}}{2^{18}(9!)^2(-q)^9},$$

where q is a constant.

7. The method according to claim 6, wherein the radio frequency waveforms are defined by the formula:

$K(t)=G*\{G_1*J_o(t,q)*G_2*C(t)\}, C(t)=\cos(\omega t)$, where G, $G_1$, and $G_2$ are gain factors.

8. The method according to claim 6, wherein the radio frequency waveforms are defined by the formula:

$L_1(t)=G*\{G_1*J_o(t,q)*C(t)*G_2*J_o(t,Q)\}, C(t)=\cos(\omega t)$,
$J_o(t,Q)=J_o(t,q)$, where Q is a constant different from q, and where G, $G_1$, and $G_2$ are gain factors.

9. The method according to claim 6, wherein the radio frequency waveforms are defined by the formula:

$L_2(t)=G*\{G_1*J_o(t,q)*C(t)+G_2*J_o(t,Q)\}, C(t)\cos(\omega t), J_o(t,Q)=J_o(t,q)$, where Q is a constant different from q, and where G, $G_1$, and $G_2$ are gain factors.

10. The method according to claim 1, wherein the radio frequency waveform is created by modulating the modified Bessel function.

11. The method according to claim 10, wherein the modified Bessel function is modulated by another modified Bessel function.

12. The method according to claim 1, wherein the radio frequency waveform is created by a superposition of another function on the modified Bessel function.

13. The method according to claim 12, wherein said superposition comprises a superposition of another modified Bessel function on the modified Bessel function.

14. A machine for creating magnetic resonance images of an object, said machine comprising:
    a magnetic field generator;
    a radio frequency signal generator, said radio frequency signal generator exciting respective atoms within said object by generating a radio frequency waveform created from a modified Bessel function;
    a radio frequency coil for receiving relaxation magnetic resonance signals; and
    a processor for processing the relaxation magnetic resonance signal, wherein said radio frequency waveform created from said modified Bessel function comprises a substantially rectangular waveform in the frequency domain.

15. The machine according to claim 14, wherein said Bessel function is a Bessel function of the First Kind of order zero.

16. The machine according to claim 15, wherein said modified Bessel function is defined by the formula:

$$J_o(t,q) = 1 - \frac{t^2}{2^2(-q)} + \frac{t^4}{2^4(2!)^2(q)^2} - \frac{t^6}{2^6(3!)^2(-q)^3} + \frac{t^8}{2^8(4!)^2(q)^4} - \frac{t^{10}}{2^{10}(5!)^2(-q)^5} + \frac{t^{12}}{2^{12}(6!)^2(q)^6} - \frac{t^{14}}{2^{14}(7!)^2(-q)^7} + \frac{t^{16}}{2^{16}(8!)^2(q)^8} - \frac{t^{18}}{2^{18}(9!)^2(-q)^9},$$

where q is a constant.

17. The machine according to claim 16, wherein the radio frequency waveforms are defined by the formula:

$K(t)=G^*\{G_1{}^*J_o(t,q)^*G_2{}^*C(t)\}, C(t)=\cos(\omega t),$ where G, $G_1$, and $G_2$ are gain factors.

18. The machine according to claim 16, wherein the radio frequency waveforms are defined by the formula:

$L_1(t)=G^*\{G_1{}^*J_o(t,q)^*C(t)^*G_2{}^*J_o(t,Q)\}, C(t)=\cos(\omega t),$
$J_o(t,Q)=J_o(t,q),$ where Q is a constant different from q, and where G, $G_1$, and $G_2$ are gain factors.

19. The machine according to claim 16, wherein the radio frequency waveforms are defined by the formula:

$L_2(t)=G^*\{G_1{}^*J_o(t,q)^*C(t)+G_2{}^*J_o(t,Q)\}, C(t)\cos(\omega t), J_o(t,Q)=J_o(t,q),$ where Q is a constant different from q, and where G, $G_1$, and $G_2$ are gain factors.

20. The machine according to claim 14, wherein the radio frequency waveform is created by modulating the modified Bessel function.

21. The machine according to claim 20, wherein the modified Bessel function is modulated by another modified Bessel function.

22. The machine according to claim 14, wherein the radio frequency waveform is created by a superposition of another function on the modified Bessel function.

23. The machine according to claim 22, wherein said superposition comprises a superposition of another modified Bessel function on the modified Bessel function.

24. A display machine for displaying magnetic resonance images of an object, said display machine comprising:
 a processor; and
 a display monitor for displaying data generated from relaxation emissions generated in a magnetic resonance machine by a radio frequency waveform created from a modified Bessel function,
 wherein said radio frequency waveform created from said modified Bessel function comprises a substantially rectangular waveform in the frequency domain.

25. The machine according to claim 24, wherein said Bessel function is a Bessel function of the First Kind of order zero.

26. The machine according to claim 25, wherein said modified Bessel function is defined by the formula:

$$J_o(t,q) = 1 - \frac{t^2}{2^2(-q)} + \frac{t^4}{2^4(2!)^2(q)^2} - \frac{t^6}{2^6(3!)^2(-q)^3} + \frac{t^8}{2^8(4!)^2(q)^4} - \frac{t^{10}}{2^{10}(5!)^2(-q)^5} + \frac{t^{12}}{2^{12}(6!)^2(q)^6} - \frac{t^{14}}{2^{14}(7!)^2(-q)^7} + \frac{t^{16}}{2^{16}(8!)^2(q)^8} - \frac{t^{18}}{2^{18}(9!)^2(-q)^9},$$

where q is a constant.

27. The machine according to claim 26, wherein the radio frequency waveforms are defined by the formula:

$K(t)=G^*\{G_1{}^*J_o(t,q)^*G_2{}^*C(t)\}, C(t)=\cos(\omega t),$ where G, $G_1$, and $G_2$ are gain factors.

28. The machine according to claim 26, wherein the radio frequency waveforms are defined by the formula:

$L_1(t)=G^*\{G_1{}^*J_o(t,q)^*C(t)^*G_2{}^*J_o(t,Q)\}, C(t)=\cos(\omega t),$
$J_o(t,Q)=J_o(t,q),$ where Q is a constant different from q, and where G, $G_1$, and $G_2$ are gain factors.

29. The machine according to claim 26, wherein the radio frequency waveforms are defined by the formula:

$L_2(t)=G^*\{G_1{}^*J_o(t,q)^*C(t)+G_2{}^*J_o(t,Q)\}, C(t)\cos(\omega t), J_o(t,Q)=J_o(t,q),$ Where Q is a constant different from q, and where G, $G_1$, and $G_2$ are gain factors.

30. The machine according to claim 24, wherein the radio frequency waveform is created by modulating the modified Bessel function.

31. The machine according to claim 30, wherein the modified Bessel function is modulated by another modified Bessel function.

32. The machine according to claim 24, wherein the radio frequency waveform is created by a superposition of another function on the modified Bessel function.

33. The machine according to claim 32, wherein said superposition comprises a superposition of another modified Bessel function on the modified Bessel function.

34. A machine for examining an object using magnetic resonance imaging data, said machine comprising:
 means for subjecting said object to a constant magnetic field;
 means for exciting atoms in said object within said constant magnetic field with a radio frequency waveform created from a modified Bessel function; and
 means for measuring relaxation magnetic resonance signals from said atoms,
 wherein said radio frequency waveform created from said modified Bessel function comprises a substantially rectangular waveform in the frequency domain.

35. The machine according to claim 34, further comprising:
 means for processing said relaxation magnetic resonance signals into viewable information; and
 means for displaying said viewable information.

36. The machine according to claim 34, wherein said atoms are $^1$H atoms.

37. The machine according to claim 34, wherein said atoms are chosen from the group consisting of $^3$He, $^{13}$C, $^{15}$N, $^{17}$O, $^{19}$F, $^{23}$Na, $^{31}$P, $^{31}$K, $^{65}$Cu, and $^{129}$Xe.

38. The machine according to claim 34, wherein said Bessel function is a Bessel function of the First Kind of order zero.

39. The machine according to claim 38, wherein said modified Bessel function is defined by the formula:

$$J_o(t, q) = 1 - \frac{t^2}{2^2(-q)} + \frac{t^4}{2^4(2!)^2(q)^2} - \frac{t^6}{2^6(3!)^2(-q)^3} + \frac{t^8}{2^8(4!)^2(q)^4} - \frac{t^{10}}{2^{10}(5!)^2(-q)^5} + \frac{t^{12}}{2^{12}(6!)^2(q)^6} - \frac{t^{14}}{2^{14}(7!)^2(-q)^7} + \frac{t^{16}}{2^{16}(8!)^2(q)^8} - \frac{t^{18}}{2^{18}(9!)^2(-q)^9},$$

where q is a constant.

40. The machine according to claim 39, wherein the radio frequency waveforms are defined by the formula:

$K(t) = G^*\{G_1 {}^* J_o(t,q) {}^* G_2 {}^* C(t)\}, C(t) = \cos(\omega t),$ where G, $G_1$, and $G_2$ are gain factors.

41. The machine according to claim 39, wherein the radiofrequency waveforms are defined by the formula:

$L_1(t) = G^*\{G_1 {}^* J_o(t,q) {}^* C(t) {}^* G_2 {}^* J_o(t,Q)\}, C(t) = \cos(\omega t),$
$J_o(t,Q) = J_o(t,q),$ where Q is a constant different from q, and where G, $G_1$, and $G_2$ are gain factors.

42. The machine according to claim 39, wherein the radio frequency waveforms are defined by the formula:

$L_2(t) = G^*\{G_1 {}^* J_o(t,q) {}^* C(t) + G_2 {}^* J_o(t,Q)\}, C(t)\cos(\omega t), J_o(t,Q) = J_o(t,q),$ where Q is a constant different from q, and where G, $G_1$, and $G_2$ are gain factors.

43. The machine according to claim 34, wherein the radio frequency waveform is created by modulating the modified Bessel function.

44. The machine according to claim 43, wherein the modified Bessel function is modulated by another modified Bessel function.

45. The machine according to claim 34, wherein the radio frequency waveform is created by a superposition of another function on the modified Bessel function.

46. The machine according to claim 45, wherein said superposition comprises a superposition of another modified Bessel function on the modified Bessel function.

47. A method of examining an object using magnetic resonance imaging data, said method comprising the steps of:
subjecting said object to a constant magnetic field;
exciting atoms in said object within said constant magnetic field with a radio frequency waveform created by superposition of a function on a Bessel function; and
measuring relaxation magnetic resonance signals from said atoms.

48. The method according to claim 47, further comprising the steps of:
processing said relaxation magnetic resonance signals into viewable information; and
displaying said viewable information.

49. A machine for creating magnetic resonance images of an object, said machine comprising:
a magnetic field generator;
a radio frequency signal generator, said radio frequency signal generator exciting respective atoms within said object by generating a radio frequency waveform created by superposition of a function on a Bessel function;
a radio frequency coil for receiving relaxation magnetic resonance signals; and
a processor for processing the relaxation magnetic resonance signal.

50. A display machine for displaying magnetic resonance images of an object, said display machine comprising:
a processor; and
a display monitor for displaying data generated from relaxation emissions generated in a magnetic resonance machine by a radio frequency waveform created by superposition of a function on a Bessel function.

51. A machine for examining an object using magnetic resonance imaging data, said machine comprising:
means for subjecting said object to a constant magnetic field;
means for exciting atoms in said object within said constant magnetic field with a radio frequency waveform created by superposition of a function on a Bessel function; and
means for measuring relaxation magnetic resonance signals from said atoms.

52. The machine according to claim 51, further comprising:
means for processing said relaxation magnetic resonance signals into viewable information; and
means for displaying said viewable information.

* * * * *